(12) United States Patent
Endo et al.

(10) Patent No.: US 7,416,960 B2
(45) Date of Patent: Aug. 26, 2008

(54) METHOD FOR MANUFACTURING SOI SUBSTRATE

(75) Inventors: Akihiko Endo, Tokyo (JP); Tatsumi Kusaba, Tokyo (JP); Hidehiko Okuda, Tokyo (JP); Etsurou Morita, Tokyo (JP)

(73) Assignee: Sumco Corporation, Tokyo (JP)

( * ) Notice: Subject to any disclaimer, the term of this patent is extended or adjusted under 35 U.S.C. 154(b) by 0 days.

(21) Appl. No.: 11/855,754

(22) Filed: Sep. 14, 2007

(65) Prior Publication Data

US 2008/0014717 A1 Jan. 17, 2008

Related U.S. Application Data

(63) Continuation of application No. 11/346,639, filed on Feb. 3, 2006, now Pat. No. 7,354,844.

(30) Foreign Application Priority Data

Feb. 4, 2005 (JP) ............................. 2005-028502

(51) Int. Cl.
*H01L 21/46* (2006.01)
(52) U.S. Cl. ............................. 438/455; 257/E21.568
(58) Field of Classification Search ................ 438/455; 257/E21.122, E21.568
See application file for complete search history.

(56) References Cited

U.S. PATENT DOCUMENTS

| | | | |
|---|---|---|---|
| 6,403,450 | B1 | 6/2002 | Maleville et al. |
| 6,653,209 | B1 | 11/2003 | Yamagata |
| 2003/0181001 | A1 | 9/2003 | Aga et al. |
| 2004/0060899 | A1 | 4/2004 | Waldhauer et al. |
| 2006/0118935 | A1* | 6/2006 | Kamiyama et al. .......... 257/684 |

* cited by examiner

FOREIGN PATENT DOCUMENTS

EP 1 085 562 A3 6/2004

OTHER PUBLICATIONS

Thilderkvist, AnnaLena, et al., "Surface Finishing of Cleaved SOI Films Using Epi Technologies", 2000 IEEE International SOI Conference Proceedings, Oct. 2000, pp. 12-13.

*Primary Examiner*—Bradley K Smith
(74) *Attorney, Agent, or Firm*—Duane Morris LLP

(57) ABSTRACT

The object of the invention is to provide a method for manufacturing an SOI layer which is devoid of damages, has a reduced variation in thickness, and is uniform in thickness. The object is met by providing a method for manufacturing an SOI substrate comprising the steps of forming an oxide film at least on one surface of a first silicon substrate, implanting hydrogen ions from the surface of the first silicon substrate thereby forming an ion-implantation zone in the interior of the first silicon substrate, bonding the first silicon substrate over a second silicon substrate with the oxide film interposed thereby forming a laminated assembly, subjecting the laminated assembly to a first heating treatment consisting of heating at a specified temperature, so that the first silicon substrate is split at the ion-implantation zone thereby manufacturing a bonded substrate, flattening the exposed surface of the SOI layer by subjecting the bonded substrate to wet etching, subjecting the bonded substrate to a second heating treatment consisting of heating at 750 to 900° C. in an oxidative atmosphere thereby reducing damages inflicted to the SOI layer, and subjecting the resulting bonded substrate to a third heating treatment consisting of heating at 900 to 1200° C. thereby enhancing the bonding strength of the bonded substrate.

7 Claims, 1 Drawing Sheet

METHOD FOR MANUFACTURING SOI SUBSTRATE

CROSS-REFERENCES TO RELATED APPLICATIONS

This application is a continuation of application Ser. No. 11/346,639 filed on Feb. 3, 2006 now U.S. Pat No. 7,354,844, and claims priority of Japanese Application No. 2005-025802 filed Feb. 4, 2005, the entire disclosure of which is hereby incorporated by reference.

BACKGROUND OF THE INVENTION

1. Field of the Invention

The present invention relates to a method for manufacturing an SOI (silicon on insulator) substrate wherein an SOI layer is formed on an oxide film using hydrogen ion-implantation technique.

2. Description of the Related Art

A method has been proposed for manufacturing an SOI substrate (for example, see Patent Document 1). The method comprises forming an oxide film on a surface of a first silicon substrate, implanting a high concentration of hydrogen atoms into the interior of the silicon substrate to form an ion-implantation zone at a specified depth from the surface of the substrate, bonding the first silicon substrate over a second silicon substrate to form a laminated assembly, heating the laminated assembly to 500° C. or higher, thereby separating the first substrate assembly from the second substrate assembly with the hydrogen ion-implantation zone at a boundary, and forming a semiconductor SOI layer on a surface of the second substrate. According to this method, it is possible to manufacture an SOI substrate comprising a second silicon substrate, an oxide film formed thereon and serving as a buried oxide film, and a semiconductor SOI layer formed on the top of the oxide film.

However, according to the conventional method described above for manufacturing an SOI substrate, the first silicon substrate is separated at the hydrogen ion-implantation zone, and thus the resulting SOI substrate suffers from crystal defects on the cleaved face. To solve this problem, a treatment consisting of removing a superficial layer having crystal defects from the cleaved face was suggested, and, as one of such treatments, a CMP (chemical mechanical polishing) method was proposed.

Patent Document 1: Japanese Unexamined Patent Application Publication No. 5-211128 (claims)

According to the aforementioned conventional method for manufacturing an SOI substrate, ions forming the hydrogen ion-implantation zone contain reactive ions that may have a damaging effect on the resulting SOI layer. Namely, since the reactive ions serve as an etchant and etch the surface of the SOI layer formed on the oxide film by the heat treatment for separating the first silicon substrate at the ion-implantation zone, they will inflict damage on the SOI layer, and particularly on its superficial layer which remains a problem to be solved. In addition, in the conventional CMP method, it is impossible to maintain the uniformity of the thickness over the entire surface of the SOI layer, because the entire layer is turned into a thin membrane at one time. Also, the amount removed from the SOI layer surface is not necessarily uniform. If the initial thickness of the SOI layer shows a variation over the entire layer, the variation may cause the degraded uniformity over the entire layer.

SUMMARY OF THE INVENTION

The object of the present invention is to provide a method for manufacturing an SOI substrate whereby it is possible to manufacture an SOI substrate in which the crystal integrity of the SOI layer is not seriously damaged, and the variation in thickness of the SOI layer is effectively suppressed, i.e., the thickness of the SOI layer becomes uniform.

As shown in FIG. 1, a first aspect of the present invention as described in Claim 1 relates to a method for manufacturing an SOI substrate comprising the steps of forming an oxide film 21 at least on one surface of a first silicon substrate 14, implanting hydrogen ions from the surface of the first silicon substrate 14 thereby forming an ion-implantation zone 16 in the interior of the first silicon substrate 14, bonding the first silicon substrate 14 over a second silicon substrate 12 with the oxide film 21 interposed thereby forming a laminated assembly 15, subjecting the laminated assembly 15 to a first heating treatment consisting of heating at a specified temperature, so that the first silicon substrate 14 is split at the ion-implantation zone 16 thereby manufacturing a bonded substrate 18 in which a thin SOI layer 13 is formed on the second silicon substrate 12 with the oxide film 21 interposed, flattening the exposed surface of the SOI layer 13 by subjecting the bonded substrate 18 to wet etching, subjecting the bonded substrate 18 to a second heating treatment consisting of heating at 750 to 900° C. in an oxidative atmosphere thereby reducing damages inflicted to the SOI layer 13, and subjecting the resulting bonded substrate 18 to a third heating treatment consisting of heating at 900 to 1200° C. thereby enhancing the bonding strength of the bonded substrate 18.

According to the method described in Claim 1 for manufacturing an SOI substrate, since the exposed surface of the SOI layer 13 is flattened by wet etching, it is possible not only to remove damages present on the surface of the SOI layer 13 coincident with the exposed surface of the ion-implantation zone 16 where the damages occur as a result of the first heating treatment, but also to avoid inflicting additional damages onto the exposed surface of the SOI layer 13, thereby reducing the variation in thickness of the SOI layer 13, and enhancing the uniformity of thickness of the SOI layer 13.

Furthermore, according to the method described in Claim 1 for manufacturing an SOI substrate, since the bonded substrate 18 is subjected to the second heating treatment consisting of heating at 750 to 900° C. in an oxidative atmosphere, it is possible to reduce damages inflicted to the SOI layer 13. More specifically, the superficial layer of the SOI layer which abounds with damages as a result of hydrogen ion-implantation is subjected to oxidation, and, as a consequence, the damaged superficial layer turns into an $SiO_2$ film (oxide film) which can be removed by being dissolved in an HF solution. Moreover, according to the method of the invention, since wet etching is introduced before the second heating treatment, the thickness of the SOI layer 13 is smaller than would be observed if the second heating treatment is undertaken without prior wet etching, and thus reduction of damages of the SOI layer 13 can be achieved in a shorter period of time. According to the inventive method, the second heating treatment is introduced prior to the third heating treatment which is undertaken to enhance the bonding strength of the bonded substrate. This is because if the bonded substrate is subjected directly to an oxidative heating treatment consisting of heating to 900° C. or higher, damages still left in the SOI layer combined with interstitial silicon atoms occurring as a result of the oxidation of silicon will cause the generation of crystal defects such as dislocations which will in turn degrade the crystal structure of the SOI layer 13 of the SOI substrate 11.

In particular, if the bonded substrate is subjected directly to a heating treatment consisting of heating to 900° C. or higher, the oxidation reaction proceeds at such a high speed that a large number of interstitial silicon atoms will develop in a short period of time which will then increase the incidence of crystal defects. On the contrary, if the second heating treatment consisting of heating to a lower temperature, i.e., 900° C. or lower is carried out prior to the third heating treatment, the development of crystal defects such as dislocations which would be generated if the third heating treatment consisting of heating to 900° C. or higher is performed without the second heating treatment can be safely avoided. Thus, introduction of the second treatment reduces the damage to the SOI layer 13, and prevents degradation of the crystal structure of the SOI layer 13.

The amount removed due to wet etching and the duration of the second heating treatment relate with each other in terms of the quality of the resulting SOI substrate, and their relative contributions in the product of an SOI substrate 11 is determined by the nature of the required quality of the SOI substrate. If the requirement for the high uniformity of the thickness of the SOI layer 13 is emphasized rather than on the quality of the crystal structure of the SOI layer 13, the duration of the second heating treatment should be emphasized at the expense of the amount removed by the wet etching. On the contrary, if the requirement for the high quality of the crystal structure of the SOI layer 13 is emphasized rather than for the uniformity of the thickness of the SOI layer 13, the amount by the wet etching should be emphasized at the expense of the uniformity of the thickness of the SOI layer 13. This is because wet etching is suitable for the crystal structure of the SOI layer 13 while oxidative treatment (the second heating treatment) is suitable for the uniformity of thickness of the SOI layer 13.

A second aspect of the present invention as described in Claim 2 relates to a method for manufacturing an SOI substrate comprising the steps of forming an oxide film 21 at least on one surface of a first silicon substrate 14, implanting hydrogen ions from the surface of the first silicon substrate 14 thereby forming an ion-implantation zone 16 in the interior of the first silicon substrate 14, bonding the first silicon substrate 14 over a second silicon substrate 12 with the oxide film 21 interposed thereby forming a laminated assembly 15, subjecting the laminated assembly 15 to a first heating treatment consisting of heating at a specified temperature, so that the first silicon substrate 14 is split at the ion-implantation zone 16 thereby manufacturing a bonded substrate 18 in which a thin SOI layer 13 is formed on the second silicon substrate 12 with the oxide film 21 interposed, subjecting the bonded substrate 18 to a second heating treatment consisting of heating at 750 to 900° C. thereby reducing damages inflicted to the SOI layer 13, and subjecting the resulting bonded substrate 18 to a third heating treatment consisting of heating at 900 to 1200° C. thereby enhancing the bonding strength of the bonded substrate 18.

The method described in Claim 2 for manufacturing an SOI substrate is suitable for the manufacture of SOI substrates 11 for which the requirement for the uniformity of the thickness of the SOI layer 13 is more emphasized rather than for the quality of the crystal structure of the SOI layer 13. In the manufacture of SOI substrates according to the method described in Claim 2, since the second treatment consisting of heating to a comparatively low temperature, i.e., 900° C. or lower is introduced prior to the third heating treatment consisting of heating to 900° C. or higher, it is possible to prevent residual damage in the SOI layer 13 from developing into crystal defects such as dislocations, and rather to eliminate such residual damages in SOI layer 13 thereby effectively preventing the deterioration of crystal structure of the SOI layer 13.

A third aspect of the present invention as described in Claim 3 relates to a method for manufacturing an SOI substrate comprising the steps of forming an oxide film 21 at least on one surface of a first silicon substrate 14, implanting hydrogen ions from the surface of the first silicon substrate 14 thereby forming an ion-implantation zone 16 in the interior of the first silicon substrate 14, bonding the first silicon substrate 14 over a second silicon substrate 12 with the oxide film 21 interposed between the first and second substrates thereby forming a laminated assembly 15, subjecting the laminated assembly 15 to a first heating treatment consisting of heating at a specified temperature, so that the first silicon substrate 14 is split at the ion-implantation zone 16 thereby manufacturing a bonded substrate 18 in which a thin SOI layer 13 is formed on the second silicon substrate 12 with the oxide film 21 interposed, flattening the exposed surface of the SOI layer 13 by subjecting the bonded substrate 18 to wet etching, and subjecting the resulting bonded substrate 18 to a second heating treatment consisting of heating at 900 to 1200° C. thereby enhancing the bonding strength of the bonded substrate 18.

The method described in Claim 3 for manufacturing an SOI substrate is suitable for the manufacture of SOI substrates 11 for which more emphasis is placed on the requirement for the quality of the crystal structure of the SOI layer 13 than for the uniformity of thickness of the SOI layer 13. In the manufacture of SOI substrates according to the method described in Claim 3, since wet etching is undertaken for flattening the exposed surface of the SOI layer 13, it is possible to reduce the variation in thickness of the SOI layer 13 and render the thickness of the SOI layer 13 uniform without inflicting damage to the surface of the SOI layer 13.

According to the embodiment of the invention, a first silicon substrate is separated at an ion-implantation zone during the first heating treatment to manufacture a bonded substrate comprising a thin SOI layer formed on a second silicon substrate with an oxide film interposed, and then the bonded substrate has its surfaces flattened by wet etching so that the exposed surface of the SOI layer is also flattened. Therefore, it is possible to remove damage on the exposed surface of the SOI layer which corresponds to the ion-implantation zone which may suffer from damage during the first heating treatment. This renders the surface of the SOI layer devoid of damages and its layer thickness uniform, and reduces the variation in thickness of the SOI layer.

Furthermore, according to the embodiment of the invention, a second heating treatment consisting of heating at 750 to 900° C. in an oxidative atmosphere is introduced before the third heating treatment consisting of heating at 900° C. or higher to enhance the bonding strength of a bonded substrate. This results in effective prevention of the development of residual damage in SOI layer into crystal defects such as dislocations. Also degradation of the quality of crystal structure of the SOI layer which would otherwise result from crystal defects can be effectively avoided.

DESCRIPTION OF THE PREFERRED EMBODIMENTS

Figure 1:
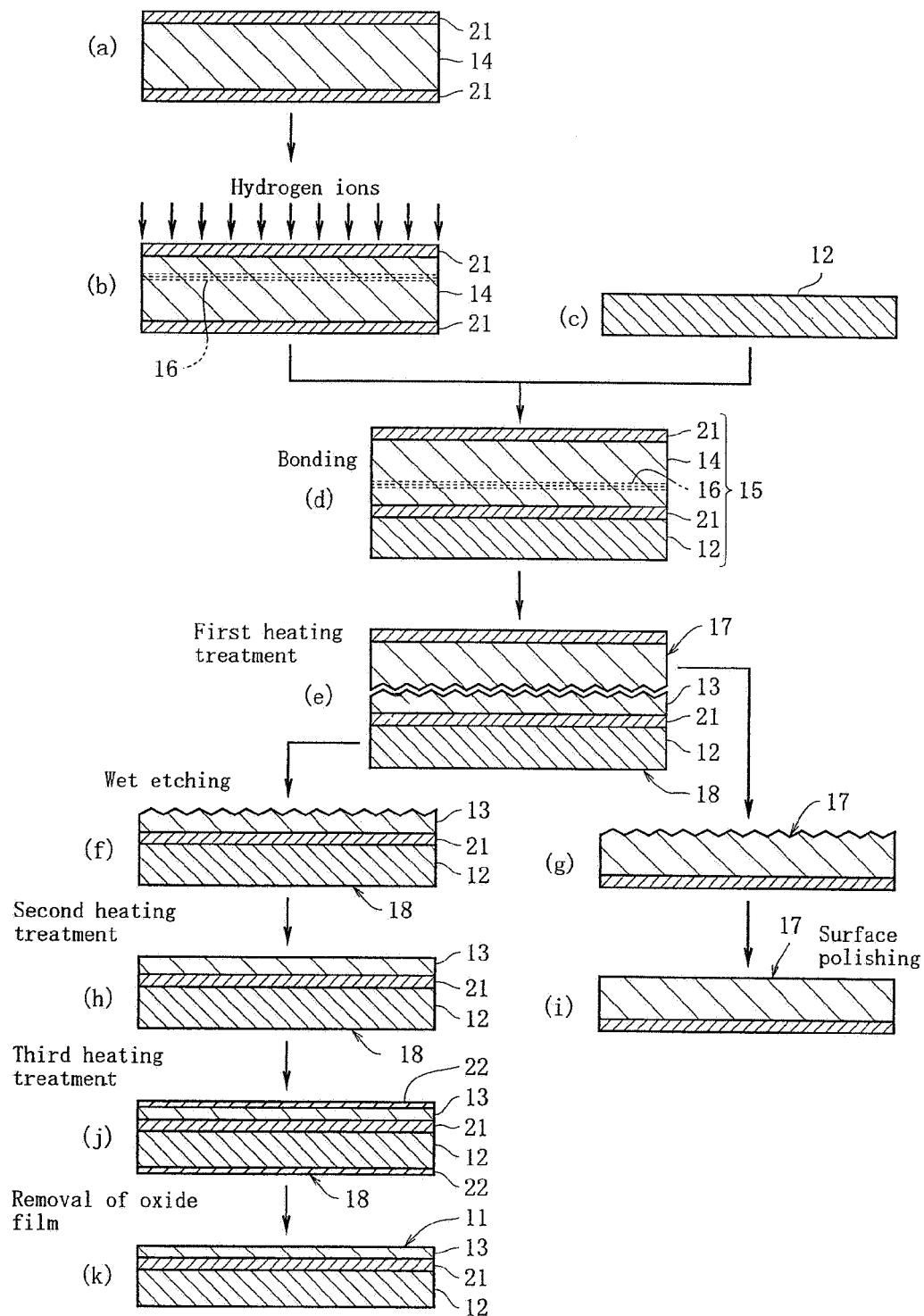
FIG. 1 is a diagram for showing the steps of a method for manufacturing an SOI substrate representing an embodiment of the invention.

Next, the preferred embodiments in the execution of the present invention will be described below with reference to the attached drawing.

As shown in FIG. 1, an SOI substrate 11 comprises a second silicon substrate 12 composed of silicon single crystal, and an SOI layer 13 composed of silicon single crystal bonded to the second silicon substrate 12 with a first oxide film 21 interposed. The first oxide film 21 is a silicon oxide film ($SiO_2$ film) having an electric insulating property. In the particular embodiment shown in the FIGURE, the second silicon substrate 12 has no additional oxide film. However, an additional oxide film may be formed on the open surface of the second silicon substrate 12, although such additional membrane is not depicted in the FIGURE. The SOI layer 13 has a thickness of 10 to 200 nm, preferably 10 to 70 nm. This is because: if the SOI layer 13 has a thickness below 10 nm, formation of the SOI layer 13 would be difficult, while if the SOI layer 13 has a thickness over 200 nm, the variation in thickness of the SOI layer 13 would be so large that it would be impossible to render the SOI layer 13 uniform in thickness.

The inventive method as described above for manufacturing an SOI substrate will be described.

First, a first silicon substrate 14 composed of silicon single crystal is prepared. Then, a first oxide film 21 (FIG. 1(*a*)) composed of silicon oxide ($SiO_2$ film) having an electric insulating property is formed not only on the top surface of the first silicon substrate 14 but also on its bottom and side surfaces (not illustrated). The first oxide film 21 has a thickness of 50 to 300 nm, preferably 100 to 200 nm. The reason why the thickness of the first oxide film 21 is limited to the range of 50 to 300 nm is as follow: if the first oxide film 21 has a thickness less than 50 nm, voids would readily develop during the bonding step because the void elimination due to the fluidity characteristic with oxide film heated at a high temperature would not work effectively, while if the first oxide film has a thickness over 300 nm, the uniformity of thickness of the buried oxide film would not meet the requirement for device products. The aforementioned first oxide film ($SiO_2$ membrane) may be formed only on the first silicon substrate by CVD instead of by thermal oxidation.

Then, implantation of hydrogen ions into a surface of the first silicon substrate 14 is performed by radiating a beam of hydrogen ions at a dose of $4 \times 10^{16}$ to $10 \times 10^{16}$ atoms/cm$^2$ under an acceleration voltage of 20 to 200 keV. Through this operation, an ion-implantation zone 16 is formed in the interior of the first silicon substrate 14 (FIG. 1(*b*)). The reason why the dose is limited to the range of $4 \times 10^{16}$ to $10 \times 10^{16}$ atoms/cm$^2$ is as follows: if the dose is below $4 \times 10^{16}$ atoms/cm$^2$, splitting would not occur at the ion-implantation zone 16 even when the first heating treatment is undertaken, while if the dose is over $10 \times 10^{16}$ atoms/cm$^2$, the irradiated superficial layer of the first silicon substrate 14 would be torn off of itself during the implantation of hydrogen ions, which would readily turn into small particles on the surface. The reason why the acceleration voltage is limited to the range of 20 to 200 keV is as follows: if the acceleration voltage is below 20 keV, the resulting SOI layer 13 would have a too small thickness, while for generating an acceleration voltage over 200 keV, a special ion-implantation system must be required.

As a separate run, a second silicon substrate 12 composed of silicon single crystal is prepared that has the same surface areas as those of the first silicon substrate 14 (FIG. 1(*c*)). The second silicon substrate 12 may be devoid of any oxide film like the one as described above. The first silicon substrate 14 is laid over the second silicon substrate 12 to be bonded to the latter with the first oxide film 21 interposed, thereby forming a laminated assembly 15 (FIG. 1(*d*)). Then, the laminated assembly 15 is subjected to first heating treatment consisting of heating at 400 to 800° C., preferably 450 to 600° C. for 1 to 30 minutes, preferably 10 to 30 minutes in an atmosphere of nitrogen. As a result of this operation, the first substrate 14 is split at the ion-implantation zone 16 where implanted hydrogen ions are most concentrated, and the upper thick portion 17 is separated from the lower thin SOI layer 13 (FIG. 1(*e*)). The lower SOI layer 13 is intimately bonded over the second silicon substrate 12 with the first oxide film 21 interposed, and the assembly constitutes a bonded substrate 18 (FIG. 1(*e*)).

The bonded substrate 18 is then subjected to wet etching so as to flatten the exposed surface of the SOI layer 13 (FIG. 1(*f*)). Wet etching may be based on the use of a mixture of an oxidative agent capable of oxidizing the surface of silicon crystal and a solution capable of dissolving silicon dioxide. The preferred oxidative agent may include a solution obtained by dissolving ozone in an aqueous solution of hydrofluoric acid, a mixture of hydrofluoric acid and nitric acid, and an aqueous solution of ammonia and hydrogen peroxide. Alternatively, wet etching may be based on an aqueous alkali solution capable of directly dissolving silicon. Suitable aqueous alkali solutions may include aqueous solutions of sodium hydroxide and potassium hydroxide. The etching system may be a batch type which allows one to deal with a plurality of substrates at one time, or a single substrate type. Regardless of whether a batch type or a single substrate type is used for the etching system, proper care should be taken according to the etching type: when a batch type is used, the circulation of solution through the etching tank and the interval between adjacent substrates placed in the tank should be properly adjusted to ensure the improved uniformity of thickness of substrates, and when a single substrate type is used, the pouring of solution to each substrate and the speed for rotating the substrate should be properly adjusted, and for both the types, the concentration and temperature of solution should also be properly adjusted.

The bonded substrate 18 is then subjected to the second heating treatment consisting of heating at 750 to 900° C., preferably at 800 to 850° C. for 1 to 15 hours in an oxygen atmosphere, to reduce damages inflicted to the SOI layer 13 (FIG. 1(*h*)). The reason why the heating temperature of the second heating treatment is limited to the range of 750 to 900° C. is as follows: if the heating temperature is below 750° C., treatment would take over 15 hours which is undesirable for mass production, while if the heating temperature is over 900° C., residual damages in SOI layer 13 would develop into crystal defects such as dislocations which would degrade the quality of crystal structure of the SOI layer 13 of the SOI substrate 11. The second heating time is limited to 1 to 15 hours because: if the heating time is below 1 hour, elimination of damages would be insufficient, while if the heating time is over 15 hours, production efficiency will be wasted to no purpose.

The bonded substrate 18 with SOI layer 13 considerably devoid of damages is then subjected to the third heating treatment consisting of heating at 900 to 1200° C., preferably at 1050 to 1150° C. for 30 to 360 minutes, preferably for 60 to 180 minutes in an atmosphere of oxygen, nitrogen, or argon, or an atmosphere comprising a mixture of those gases, so that bondage of the SOI layer 13 to the second silicon substrate 12 with the first oxide film 21 interposed may be further enhanced (FIG. 1(*j*)). The reason why the heating temperature of the third heating treatment is limited to the range of 900 to 1200° C. is as follows: if the heating temperature is below 900° C., sufficiently strong bondage would not be obtained, while if the heating temperature is over 1200° C., slips would readily develop. The reason why the heating time is limited to the range of 30 to 360 minutes is as follows: if the heating time is below 30 minutes, sufficiently strong bondage would not be obtained, while if the heating time is over 360 minutes, production efficiency will be wasted to no purpose because sufficiently strong bondage can be obtained in a shorter time.

As a result of the second and third heating treatments, a second oxide film 22 is formed on the top and bottom surfaces as well as side surfaces (not illustrated) of the bonded substrate 18 wherein the upper second oxide film 22 is formed on the surface of the SOI layer 13. Immersion of the bonded substrate 18 in detergent allows the second oxide film 22 to be etched away and the bonded substrate 18 to be cleaned. The detergent preferably includes a detergent comprising an organic acid at a concentration more than 0.1 wt % but not more than 50 wt %, preferably 0.2 to 10 wt %, and hydrofluoric acid at 0.005 to 0.25 wt %, preferably 0.005 to 0.10 wt %. The organic acid preferably includes one or two or more chosen from the group comprising citric acid, succinic acid, ethylenediamine tetraacetic acid, tartaric acid, salicylic acid, oxalic acid, acetic acid and formic acid. The reason why the concentration of organic acid is limited to the range of more than 0.1 wt % to not more than 50 wt % is as follows: if the concentration of organic acid is below 0.1 wt %, the molecules of organic acid in detergent are so small in number that, even when free metal impurities derived from the second oxide film 22 disperse in detergent, they can not react with a sufficient number of the metal impurities to form complexes therefrom, and will leave unreacted metal impurities to deposit again this time on the surface of the SOI layer 13, while if the concentration of organic acid is over 50 wt %, renewed deposition of minute particles derived from the second oxide film 22 on SOI layer 13 will increase. The reason why the concentration of hydrofluoric acid is limited to the range of 0.005 to 0.25 wt % is as follows: if the concentration of hydrofluoric acid is below 0.05 wt %, the detergent could not have a sufficiently high sloughing effect on the second oxide film 22 covering the surface of the SOI layer 13, while if the concentration of hydrofluoric acid is over 0.25 wt %, the detergent will have a pH of less than 2, that is, become a strong acid that will interfere with the dissociation of organic acid into ions, thereby inhibiting the complex forming activity of the latter. In addition, in such highly acidic detergent, the charge loaded on the surface of minute particles therein will become positive which will promote the renewed deposition of those particles to the surface of the SOI layer 13.

Immersion of the bonded substrate 18 having undergone the second and third heating treatments in a detergent as described above allows the second oxide film 22 to be removed by virtue of hydrofluoric acid (HF) in the detergent, and minute particles and metal impurities residing on the surfaces of second oxide film 22 as well as metal impurities contained in second oxide film 22 disperse into the detergent. Since the detergent contains hydrofluoric acid at 0.005 to 0.25 wt % and organic acid at a concentration more than 0.1 wt % but not more than 50 wt %, and is an acidic solution with pH of 4 or lower, minute particles in detergent are negatively charged as is the surface of the SOI layer 13. In addition, metal impurities freely dispersed in solution react with the molecules of organic acid to form complexes, i.e., complex metal salts. The ions derived from those complex metal salts are negatively charged. As a consequence, since the surfaces of minute particles and metal impurities in solution are negatively charged as is the surface of the SOI layer 13, renewed or new deposition of those particles and impurities to the surface of the SOI layer can be safely avoided. The bonded substrate, when removed from the detergent, provides a cleaned SOI substrate 11 (FIG. 1(k)).

The depth of hydrogen ion-implantation (in terms of the level at which the density of implanted hydrogen ions has a peak) from the surface of the first silicon substrate 14 should be set after due consideration has been paid to the thickness of the first oxide film 21 (50 to 300 nm, or preferably 100 to 200 nm), etched amount due to cleaning (5 nm or less, or preferably 1 nm or less), thickness of the second oxide film 22 (20 to 700 nm, or preferably 50 to 300 nm), and etched amount due to wet etching (20 to 300 nm, or preferably 50 to 200 nm). The reason why the etched amount due to wet etching is limited to the range of 20 to 300 nm is as follows: if the etched amount is below 20 nm, damages inflicted during splitting will persist even after the high-temperature treatment for enhancing bondage and thus improved flatness can not be ensured, while if the etched amount is over 300 nm, etching will take such a long time that not only production efficiency will be unduly lowered, but also the uniformity of thickness of the SOI layer will be degraded and too much reaction products will be generated. The thick portion 17 generated as a result of splitting has its exposed surface flattened by polishing (FIGS. 1(g) and 1(i)). Through this operation, it is possible to reuse the resulting thick portion 17 as a first silicon substrate 14 or second silicon substrate 12 in the manufacture of SOI substrates like SOI substrate 11.

According to the aforementioned method for manufacturing an SOI substrate 11, the exposed surface of the SOI layer 13 is flattened by wet etching, and thus it is possible to remove the superficial layer of the SOI layer 13 with damages, since the laminated assembly is split at the ion-implantation zone 16 during the first heating treatment, and thus damages are most frequent on the exposed surface of resulting SOI layer. The wet etching also does not inflict any additional damages on the surface of the SOI layer 13, and reduces the variation in thickness of the SOI layer 13 as compared with conventional CMP method, i.e., ensures the uniformity of thickness of the SOI layer 13. According to the inventive method for manufacturing an SOI substrate, since the third heating treatment is introduced subsequent to the second heating treatment consisting of heating to 750 to 900° C. to enhance the bonding strength of the bonded substrate 18, it is possible to prevent crystal defects such as dislocations from being further aggravated and the quality of the crystal structure of the SOI layer 13 from being further degraded by eliminating damages from the surface of the SOI layer 13.

The amount removed due to wet etching performed in the manner as described above and the duration of the second heating treatment relate to each other in terms of the quality of resulting SOI substrate, and their relative contributions in the manufacture of an SOI substrate 11 is determined by the nature of the quality required of the SOI substrate. If the requirement for the high uniformity of thickness of the SOI layer 13 is emphasized rather than the quality of crystal structure of the SOI layer 13, the duration or intensity of the second heating treatment should be emphasized at the expense of the amount removed due to wet etching. On the contrary, if the requirement for the high quality of crystal structure of the SOI layer 13 is emphasized rather than for the uniformity of thickness of the SOI layer 13, the amount removed due to wet etching should be emphasized at the expense of the quality of the crystal structure of the SOI layer 13. Accordingly, if the requirement for the high quality of crystal structure of the SOI layer 13 is emphasized rather than for the uniformity of thickness of the SOI layer 13, the second heating treatment may be omitted. On the contrary, if the requirement for the high uniformity of the thickness of the SOI layer 13 is emphasized rather than on the quality of the crystal structure of the SOI layer 13, the step involving wet etching may be omitted.

Thus, an inventive method for manufacturing an SOI substrate from which a step involving wet etching is omitted comprises the steps of forming an oxide film 21 at least on one surface of a first silicon substrate 14, implanting hydrogen ions from the surface of the first silicon substrate 14 thereby forming an ion-implantation zone 16 in the interior of the first silicon substrate 14, bonding the first silicon substrate 14 over a second silicon substrate 12 with the oxide film 21 interposed thereby forming a laminated assembly 15, subjecting the laminated assembly 15 to a first heating treatment consisting of heating at a specified temperature, so that the first silicon substrate 14 is split at the ion-implantation zone 16 thereby manufacturing a bonded substrate 18 in which a thin SOI layer 13 is formed on the second silicon substrate 12 with the oxide film 21 interposed, subjecting the bonded substrate 18 to a second heating treatment consisting of heating at 750 to 900° C. in an oxidative atmosphere thereby reducing damages inflicted to the SOI layer 13, and subjecting the resulting bonded substrate 18 to a third heating treatment consisting of heating at 900 to 1200° C. thereby enhancing the bonding strength of the bonded substrate 18.

On the other hand, an inventive method for manufacturing an SOI substrate from which a step involving the second heating treatment is omitted comprises the steps of forming an oxide film 21 at least on one surface of a first silicon substrate 14, implanting hydrogen ions from the surface of the first silicon substrate 14 thereby forming an ion-implantation zone 16 in the interior of the first silicon substrate 14, bonding the first silicon substrate 14 over a second silicon substrate 12 with the oxide film 21 interposed thereby forming a laminated assembly 15, subjecting the laminated assembly 15 to a first heating treatment consisting of heating at a specified temperature, so that the first silicon substrate 14 is split at the ion-implantation zone 16 thereby manufacturing a bonded substrate 18 in which a thin SOI layer 13 is formed on the second silicon substrate 12 with the oxide film 21 interposed, flattening the exposed surface of the SOI layer 13 by subjecting the bonded substrate 18 to wet etching, and subjecting the resulting bonded substrate 18 to a second heating treatment consisting of heating at 900 to 1200° C. thereby enhancing the bonding strength of the bonded substrate 18.

EXAMPLE

Examples of the present invention will be described in detail with reference to Comparative Examples.

Example 1

As shown in FIG. 1, first a disc-shaped (outer diameter, 200 mm and thickness, 0.725 mm) first silicon substrate 14 composed of silicon single crystal was subjected to a heating treatment consisting of heating at 1000° C. for 5 hours in an oxygen atmosphere, to allow a first oxide film 21 to be formed on the top and bottom surfaces of the first silicon substrate 14 as well as its side surfaces. The first oxide film 21 has a thickness of about 150 nm. Then, implantation of hydrogen ions into a surface of the first silicon substrate 14 was performed by radiating a beam of hydrogen ions at a dose of $6 \times 10^{16}$ atoms/cm$^2$ under an acceleration voltage of 50 keV. Through this operation, an ion-implantation zone 16 is formed in the interior of the first silicon substrate 14 (FIG. 1(b)). The depth of the ion-implantation zone 16 (in terms of the level at which the density of implanted hydrogen ions had a peak) from the top surface was determined to be about 500 nm with the thickness of first oxide film 21 included. On the other hand, second silicon substrate 12 composed of silicon single crystal, and having the same surface areas as those of the first silicon substrate 14 described above and a thickness of 0.725 mm was prepared (FIG. 1(c)). The first silicon substrate 14 was laid over the second silicon substrate 12 to be bonded to the latter with the oxide film 21 interposed, thereby forming a laminated assembly 15 (FIG. 1(d)). Then, the laminated assembly 15 was subjected to first heating treatment consisting of heating at 500° C. for 30 minutes in an atmosphere of nitrogen. As a result of this operation, the first silicon substrate 14 was split at the ion-implantation zone 16 where implanted hydrogen ions were most concentrated, and the upper thick portion 17 was separated from the lower thin SOI layer 13 (FIG. 1(e)). The lower SOI layer 13 was intimately bonded to the second silicon substrate 12 with the first oxide film 21 interposed, and the assembly constituted a bonded substrate 18 (FIG. 1(f)).

The bonded substrate 18 was then subjected to wet etching using a mixture of HF and organic acid (tartaric acid) so that SOI layer 13 was thinned by a thickness of 200 nm as a result of etching, and the exposed surface of the SOI layer 13 was flattened. The bonded substrate 18 was then subjected to the second heating treatment consisting of heating at 900° C. for 90 minutes in an oxygen atmosphere, to reduce damages inflicted to the SOI layer 13 (FIG. 1(h)). After being removed of oxide films as a result of being immersed in HF solution, the bonded substrate 18 with SOI layer 13 was then subjected to the third heating treatment consisting of heating at 1100° C. for 120 minutes in an atmosphere of argon, so that bondage of the SOI layer 13 to the second silicon substrate 12 with the first oxide film 21 interposed may be further enhanced (FIG. 1(j)). Lastly, the bonded substrate 18 was immersed in a detergent to be cleaned which provided a cleaned SOI substrate 11 (FIG. 1(k)). The SOI substrate 11 thus obtained was made Example 1. The detergent described above contained organic acid composed of citric acid at 0.5 wt % and hydrofluoric acid at 0.01 wt %. The SOI layer 13 after cleaning had a thickness of 50 nm.

Example 2

A bonded substrate 18 was subjected to wet etching so that SOI layer 13 was thinned until its thickness was 300 nm. Not being subjected to a second heating treatment consisting of heating at 900° C., the bonded substrate 18 was immediately subjected to a heating treatment consisting of heating at 1100° C. for 120 minutes in an atmosphere of argon. Except for this alteration, the bonded substrate 18 was processed in the same manner as in Example 1 to manufacture an SOI substrate. This SOI substrate was made Example 2.

Example 3

Not being subjected to wet etching, a bonded substrate 18 immediately received a second heating treatment consisting of heating at 900° C. for 90 minutes in an oxygen atmosphere, and third heating treatment consisting of heating at 1100° C. for 120 minutes in an oxygen atmosphere in this order. Except for this alteration, the bonded substrate 18 was processed in the same manner as in Example 1 to manufacture an SOI substrate. This SOI substrate was made Example 3.

Example 4

Not being subjected to wet etching, a bonded substrate 18 immediately received a second heating treatment consisting of heating at 870° C. for 150 minutes in an oxygen atmosphere, and third heating treatment performed in the same manner as in Example 1 in this order. Except for this alteration, the bonded substrate 18 was processed in the same manner as in Example 1 to manufacture an SOI substrate. This SOI substrate was made Example 4.

Example 5

Not being subjected to wet etching, a bonded substrate 18 immediately received a second heating treatment consisting of heating at 850° C. for 190 minutes in an oxygen atmosphere, and third heating treatment performed in the same manner as in Example 1. Except for this alteration, the bonded substrate 18 was processed in the same manner as in Example 1 to manufacture an SOI substrate. This SOI substrate was made Example 5.

Example 6

Not being subjected to wet etching, a bonded substrate 18 immediately received a second heating treatment consisting of heating at 800° C. for 15 hours in an oxygen atmosphere, and third heating treatment performed in the same manner as in Example 1. Except for this alteration, the bonded substrate 18 was processed in the same manner as in Example 1 to manufacture an SOI substrate. This SOI substrate was made Example 6.

Example 7

Not being subjected to wet etching, a bonded substrate 18 immediately received a second heating treatment consisting of heating at 750° C. for 30 hours in an oxygen atmosphere, and third heating treatment performed in the same manner as in Example 1. Except for this alteration, the bonded substrate 18 was processed in the same manner as in Example 1 to manufacture an SOI substrate. This SOI substrate was made Example 7.

Comparative Example 1

Not being subjected to wet etching, a bonded substrate 18 immediately received a second heating treatment consisting of heating at 1000° C. for 12 minutes in an oxygen atmosphere, and third heating treatment performed in the same manner as in Example 1. Except for this alteration, the bonded substrate 18 was processed in the same manner as in Example 1 to manufacture an SOI substrate. This SOI substrate was made Comparative example 1.

Comparative Example 2

Not being subjected to wet etching, a bonded substrate 18 immediately received a second heating treatment consisting of heating at 950° C. for 30 minutes in an oxygen atmosphere, and third heating treatment performed in the same manner as in Example 1. Except for this alteration, the bonded substrate 18 was processed in the same manner as in Example 1 to manufacture an SOI substrate. This SOI substrate was made Comparative example 2.

<Comparison Test and Evaluation>

HF defects on SOI substrate in Examples 1 to 7 and Comparative examples 1 and 2 were observed by microscopy and their density was measured. The results are listed in Table 1.

TABLE 1

| | Wet etching, removal amount | Second heating treatment, temperature & time | Density of HF defects [/cm$^2$] |
|---|---|---|---|
| Example 1 | Done, 200 nm | Done, 900° C., 90 minutes | 0.1 |
| Example 2 | Done, 300 nm | Undone | 0.1 or less |
| Example 3 | Undone | Done, 900° C., 90 minutes | 0.2 |
| Example 4 | Undone | Done, 870° C., 170 minutes | 0.1 or less |
| Example 5 | Undone | Done, 850° C., 190 minutes | 0.1 or less |
| Example 6 | Undone | Done, 800° C., 15 hours | 0.1 or less |
| Example 7 | Undone | Done, 750° C., 30 hours | 0.1 or less |
| Comparative example 1 | Undone | Done, 1000° C., 12 minutes | 1.6 |
| Comparative example 2 | Undone | Done, 950° C., 30 minutes | 1.0 |

As is obvious from the results shown in Table 1, for the SOI substrates represented by Examples 1 and 2 in which wet etching was applied to a bonded substrate and by Example 1 and Examples 3 to 7 in which a second heating treatment consisting of heating at 750 to 900° C. was applied, the density of HF defects was reduced to 0.2/cm$^2$ or less. In contrast, for SOI substrates represented by Comparative examples 1 and 2 in which a heating treatment consisting of heating at a temperature over 900° C. was applied to a bonded substrate, the density of HF defects was elevated to 1.0/cm$^2$ or more. This merit characteristically observed in Examples 1 to 7 may be ascribed to wet etching or second heating treatment consisting of heating at 750 to 900° C. which was exclusively applied to bonded substrates designed to manufacture Examples. This indicates that the inventive method effectively achieves the object.

What is claimed is:

1. A method for manufacturing an SOI substrate comprising the steps of:
    forming an oxide film (21) at least on one surface of a first silicon substrate (14);
    implanting hydrogen ions from the surface of the first silicon substrate (14) thereby forming an ion-implantation zone (16) in the interior of the first silicon substrate (14);
    bonding the first silicon substrate (14) over a second silicon substrate (12) with the oxide film (21) interposed between the first and second substrates thereby forming a laminated assembly(15);
    subjecting the laminated assembly (15) to a first heating treatment consisting of heating at a specified temperature, so that the first silicon substrate (14) is split at the ion-implantation zone (16) thereby manufacturing a bonded substrate (18) in which a thin SOI layer (13) is formed on the second silicon substrate (12) with the oxide film (21) interposed between the SOI layer and the second substrate;
    flattening the exposed surface of the SOI layer (13) by subjecting the bonded substrate (18) to wet etching; and
    subjecting the resulting bonded substrate (18) to a second heating treatment consisting of heating at 900 to 1200° C. thereby enhancing the bonding strength of the bonded substrate (18).

2. The method of claim 1 wherein the first oxide film has a thickness in the range from 50 to 300 nm.

3. The method of claim 1 wherein the hydrogen ions are implanted by radiating the first silicon substrate with a beam of hydrogen ions at a dose of $4\times10^{16}$ to $10\times10^{16}$ atoms/cm$^2$ under an acceleration voltage of 20 to 200 kev.

4. The method of claim 1 wherein the first heating treatment is carried out at a temperature of from 400 to 800° C. for 1 to 30 minutes.

5. The method of claim 1 wherein the second heating treatment is carried out for 1 to 15 hours.

6. The method of claim 1 wherein the first oxide film has a thickness in the range from 50 to 300 nm.

7. An SOI substrate made by the method of claim 1.

* * * * *